United States Patent [19]

Wadhera et al.

[11] Patent Number: 4,705,916
[45] Date of Patent: Nov. 10, 1987

[54] EMI GASKET RETAINING MECHANISM FOR ELECTRONIC EQUIPMENT

[75] Inventors: Anil K. Wadhera, Brampton; Alex K. Tang, Mississauga; Theodore E. Basser, Downsview, all of Canada

[73] Assignee: Northern Telecom Limited, Montreal, Canada

[21] Appl. No.: 829,388

[22] Filed: Feb. 14, 1986

[51] Int. Cl.$^4$ ............................................. H05K 9/00
[52] U.S. Cl. ........................... 174/35 GC; 174/35 MS; 361/424
[58] Field of Search ..................... 174/35 GC, 35 MS; 49/479; 219/10.55 D; 361/424; 455/300, 301

[56] References Cited

U.S. PATENT DOCUMENTS 4,554,400 11/1985 Schmalzl .............................. 361/424
4,564,722  1/1986 Nordin ............................ 174/35 GC

FOREIGN PATENT DOCUMENTS 2638293  2/1978 Fed. Rep. of Germany ...... 361/424

OTHER PUBLICATIONS

D. E. Yates and R. P. Zitsch, Radio Interference Gasket, Aug. 1958, RCA Technical Note 189, 455-300.

Primary Examiner—Arthur T. Grimley
Assistant Examiner—Kathleen Heimiller
Attorney, Agent, or Firm—F. P. Turpin

[57] ABSTRACT

The invention provides a mechanism for retaining an electromagnetic interference gasket for metal cabinets adapted to enclose electronic apparatus. One of two mating surfaces is provided with pairs of slots along the mating surface. A compressible flexible gasket having a conductive outer surface is threaded in the slots in an over and under manner whereby it is retained in place along the periphery of the mating surface. Alternatively, the slots are in the shape of a keyhole. The annular portion of the keyhole is adapted to receive the gasket comfortably and the parallel sides are spaced apart a distance less than the diameter of the gasket thereby necessitating compression of the gasket to achieve insertion into the annular portion of the slot.

2 Claims, 7 Drawing Figures

EMI GASKET RETAINING MECHANISM FOR ELECTRONIC EQUIPMENT

The invention relates to electromagnetic interference (EMI) in general and more particularly to a mechanism for shielding the environment from the effects of EMI emanating from electronic equipment.

Contemporary electronic telecommunication equipment operates at very high frequencies and its packaging tends to concentrate a relatively large amount of circuitry per frame of equipment. Hence, each frame tends to act as a transmitting source of EMI to the environment. In order to prevent the nefarious effects from EMI, strict regulations were promulgated by various government agencies to define radiation interference limits.

In the majority of cases, the solution to the problem consists in enclosing the frames of equipment in a properly grounded metal box. These metal boxes usually comprise a metal frame on which metal panels may be removably secured to allow access to the equipment on the frame. In order to provide adequate EMI shielding, the mating surfaces of these panels must be electrically connected together. This is usually achieved through the use of an EMI gasket which provides an interface between mating conductive surfaces. The gasket should provide high conductivity to ensure DC continuity between mating surfaces and is usually compressible.

One known method of shielding a cabinet is to provide at least one of two mating surfaces with a channel into which a gasket of conductive rubber is inserted. Alternatively, the gasket may be glued to the inside of the channel. In such an arrangement, the channel is used to give the gasket lateral stability and to prevent its misalignment which could result through repeated removal and replacement of the panels. Another method of shielding box panels is through the use of a metallized compressible gasket attached to a metal band along its length. The metal band is secured to one of the mating surfaces so that the gasket is sandwiched between the mating surfaces when a panel is attached to the frame.

These methods of EMI control are fully operable for their intended purpose. However, because they are labor intensive their cost is very high since in one case, the sheet metal must be formed into a channel and in the other, the metal strip must be aligned properly and riveted to the flange of the panel. In addition, neither of these gasket retaining mechanisms lends itself to the in-the-field replacement of a damaged gasket.

In accordance with the invention, there is provided a gasket retaining mechanism which is relatively economical and which allows for in-the-field replacement of a damaged gasket.

A cabinet for mounting electronic equipment usually comprises a metal support frame and metal panels adapted to be secured to the frame so as to form a box. Each panel comprises an in-turned box flange for mating with the support frame and means interposed between the mating surfaces of the panels and the support frame for attenuating the leakage of electromagnetic energy radiating from the electronic equipment mounted in the frame. In accordance with the invention, the attenuating means comprises a compressible flexible gasket having a conductive outer surface. At least one of the mating surfaces has a plurality of holes distributed along its periphery, the holes being adapted to receive the gasket which is threaded in an over and under manner whereby it is retained in place along the periphery of the mating surface. When the holes in the flange are opened to one edge of the flange to form slots, the gasket may be threaded by simply pressing it into place. This gasket retaining mechanism, in addition to costing a fraction of known methods, lends itself to easy replacement or realignment by craftspersons in the installed location.

An example embodiment of the invention will now be described in conjunction with the drawings in which.

Figure 1A:
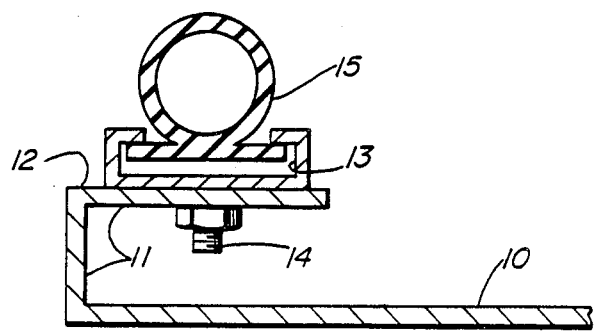
FIGS. 1A and 1B illustrate known methods of retaining EMI gaskets between mating surfaces of a metal cabinet.
Figure 1B:
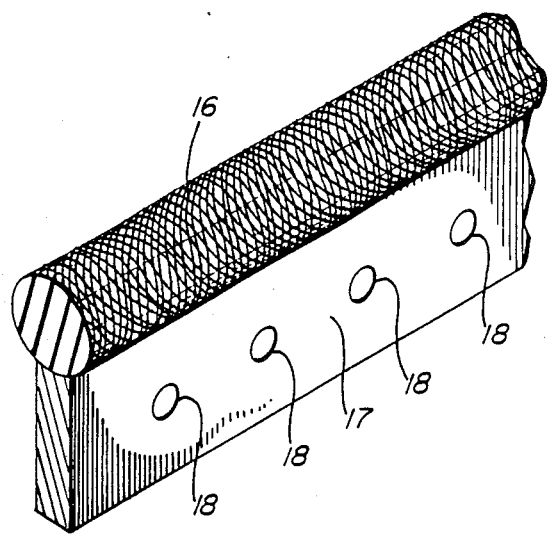

FIGS. 1A and 1B illustrate the prior art methods of gasketing mating surfaces of metal cabinets to prevent leakage of electromagnetic interference. FIG. 1A shows a metal panel 10 having an in-turned box flange 11 having a mating surface 12 on which a metal channel 13 is secured such as by bolts 14. The channel 13 is adapted to receive a gasket 15 which is usually an electrically conductive elastomeric material forming an EMI seal with a mating surface such as a frame (not shown) to which the metal panel would be secured to form one wall of a metal box. Figure 1B shows an alternative mechanism for retaining an EMI gasket between mating surfaces. A gasket 16 having a conductive surface is attached along its length to a metal strip 17 which may be secured to a mating surface by riveting through the holes 18 or by spot welding the metal strip to the mating surface.

Figure 3:
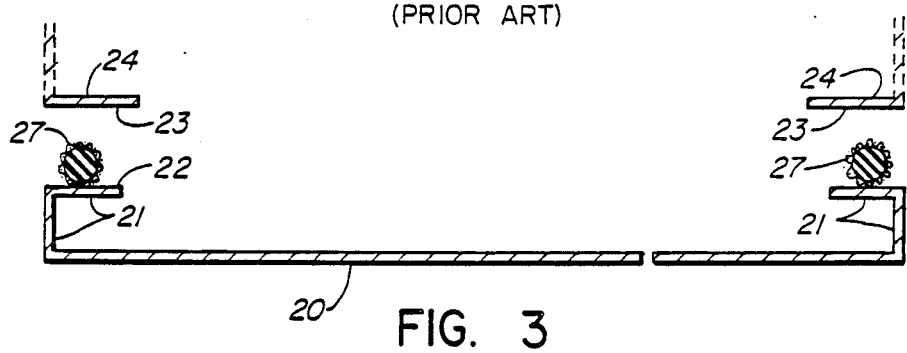
FIG. 3 is a partial cross-section of the panel of FIG. 2 taken at line 3—3.
Figure 2:
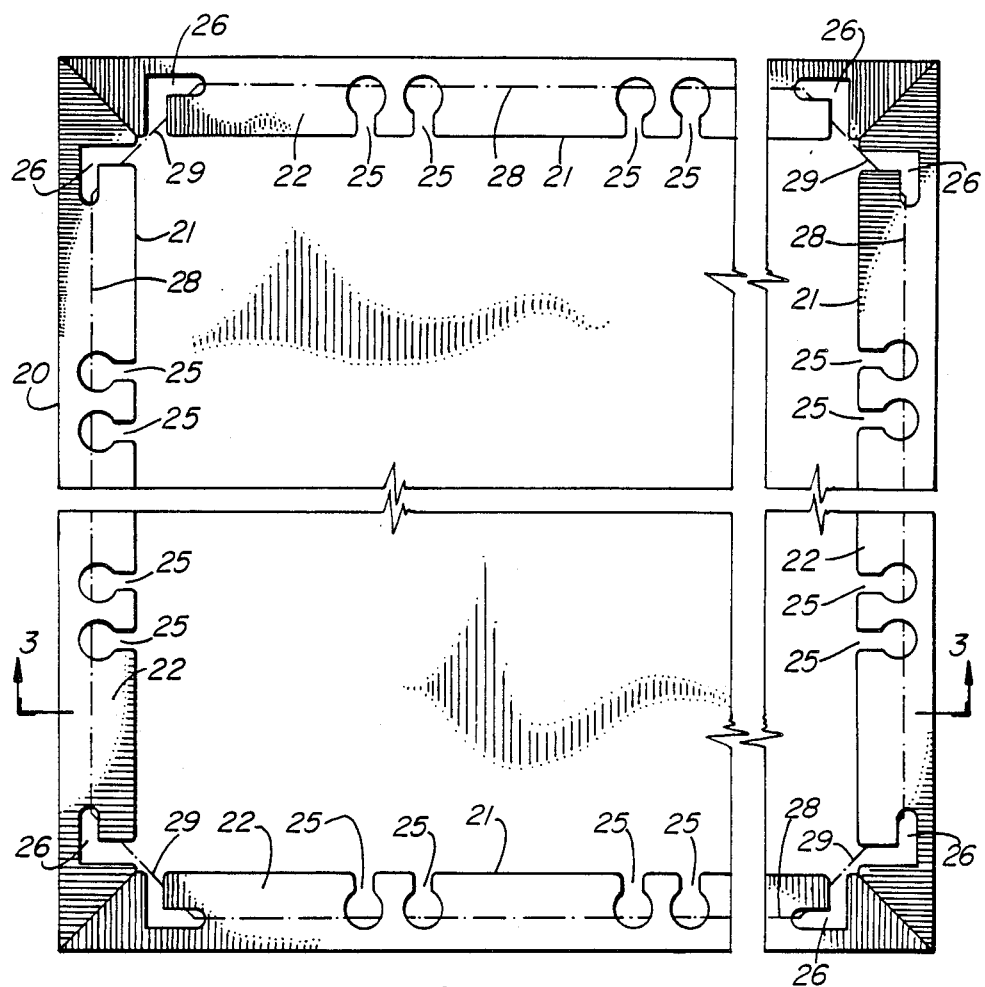
FIG. 2 shows a metal side panel having an EMI gasket retaining mechanism in accordance with the invention.

FIGS. 2 to 5 illustrate a mechanism for retaining an EMI gasket in accordance with the invention. FIG. 2 is a plan view of the inside face of a metal panel adapted to be secured on a frame in a conventional manner to form a wall thereof and FIG. 3 is a simplified cross-sectional view taken at points 3—3 of FIG. 2. There is shown a rectangular panel 20 having an in-turned box flange 21 to provide a surface 22 for mating with a surface 23 of a frame 24 (shown partly in FIG. 3) adapted to enclose electronic equipment. The mating surface 22 is provided with pairs of slots 25 distributed along the length of the flange. The distance between the pairs of slots should be large relative to the distance between the holes of a pair. As indicated in FIG. 2 the slots adjacent the corners of the panel 20 may be replaced with L-shaped slots 26 leading away from the corners. A gasket 27 may then be threaded in the slots 25 and 26 of the flange as indicated by the line 28 of FIG. 2. As is illustrated, the gasket 27 is threaded in the slots 25 so that it is on the mating surfaces between the pairs of slots and under the mating surfaces between the slots of a pair so that the amount of gasket in contact with the mating surface 23 of the frame 24 is maximized. The pairs of slots should also be distributed along the flange so that the gasket 27 enters the L-shaped slots going towards the corners so that it traverses the corner of the flange under the mating surface 22 as indicated at 29. Since EMI gaskets are very vulnerable at the corners of the panels, this minimizes the damage problem. The use of L-shaped slots at the corners allows the gasket to be threaded tighter around a corner than would be the case if keyhole slots were used adjacent thereto.

Figures 4, 5A, 5B:
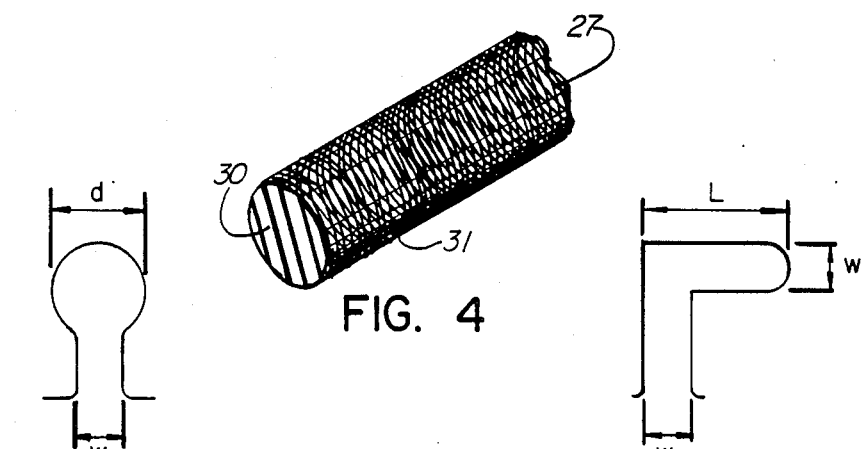
FIG. 4 illustrates a typical gasket used in FIG. 2.
FIGS. 5A and 5B illustrate the shapes of the holes and slots in the panel of FIG. 2.

The gasket 27 (illustrated in FIG. 4) may conveniently be a commercially available item known as TECKNIT (trademark). It comprises a core 30 of either neoprene closed cell sponge or silicone closed cell sponge, or very low closure force rubber tubing and a conductive surface which is ideally a double layer of knitted wire of Monel (trademark). As shown in FIG. 5A, the diameter of the annular portion of the keyhole slots should be of a size to receive comfortably the gasket 27 whereas the parallel sides of the slot should be spaced apart a distance W whereby compression of the gasket 27 is necessary to achieve its insertion in the annular portion of the slot. The width of the L-shaped slot should be comparable to that of the neck of the keyhole slots and the length of the closed portion of the slot should be adequate to retain the gasket 27 as it traverses the slot at forty-five degrees as shown in FIG. 2.

It should of course be realized that all of the slots can be replaced with holes the size of the annular portion of the keyhole slots. However, that gasket retaining mechanism is more labor intensive and hence not as desirable as the described embodiment. Also, any one of two mating surfaces may be provided with the gasket retaining mechanism of the invention; that is, the mating surface of the frame may be provided with the holes and/or slots adapted to receive a compressible conductive gasket.

The above invention provides an EMI gasket retaining mechanism which is very economical relative the known methods and which lends itself to on-site repairs by maintenance personnel.

What is claimed is:

1. In a cabinet for mounting electronic equipment comprising a metal support frame and metal panels adapted to be secured to said frame so as to form a box, each panel comprising an in-turned box flange for mating with the support frame and means interposed between the mating surfaces of the panels and the support frame for attenuating the leakage of electromagnetic energy radiating from the electronic equipment mounted in the frame, the attenuating means comprising, a compressible flexible gasket having a conductive outer surface, at least one of the mating surfaces having a plurality of slots distributed in pairs along its periphery, the gasket being threaded in an over and under manner so that it is on top of the mating surface between the pairs of slots, each slot not adjacent a right-angle corner of the mating surface being in the shape of a keyhole having an annular portion adapted to receive the gasket comfortably and a channel portion having parallel sides spaced apart a distance less than the diameter of the gasket, the gasket holding slots adjacent a right-angle corner of the mating surface each comprising an L-shaped slot leading away from the corner, the width of the slot corresponding to that between the parallel sides of the keyhole slots.

2. A cabinet for mounting electronic equipment as defined in claim 1 wherein the outside edges of the slots are slightly rounded thereby to facilitate compression of the gasket into the slot.

* * * * *